United States Patent [19]

Rose

[11] 4,272,892

[45] Jun. 16, 1981

[54] AUTOMATIC TEST PROBE POSITIONING APPARATUS

[75] Inventor: Stanley E. Rose, Phoenix, Ariz.

[73] Assignee: Omnicomp, Inc., Phoenix, Ariz.

[21] Appl. No.: 65,539

[22] Filed: Aug. 10, 1979

[51] Int. Cl.³ .......................... G01B 5/00; B27G 23/00
[52] U.S. Cl. .................................. 33/185 R; 33/1 M
[58] Field of Search ................ 33/1 M, 1 MP, 125 C, 33/125 R, 185, 174 TA, 174 R, 45.3

[56] References Cited

U.S. PATENT DOCUMENTS

| | | | |
|---|---|---|---|
| 2,093,048 | 9/1937 | Ike | 33/453 |
| 2,794,594 | 6/1957 | Ergen et al. | 33/1 MP |
| 3,495,519 | 2/1970 | Alfsen et al. | 33/1 M X |
| 3,918,167 | 11/1975 | Gerber | 33/125 C X |

*Primary Examiner*—Harry N. Haroian
*Attorney, Agent, or Firm*—Cahill, Sutton & Thomas

[57] ABSTRACT

A test probe positioning machine includes first and second stepper motors connected to spaced first and second vertical pivot pins extending from a support. A flat slide surface is disposed on the support adjacent and perpendicular to the vertical pivot pins. First and second elongated threaded shafts driven by the stepper motors engage first and second threaded nut blocks. The nut blocks are pivotally connected together by a vertical pivot pin and are supported upon a low friction foot element which slides along the slide surface. An insulating probe support is connected to one of the nut blocks and can be raised or lowered by a solenoid in response to a control signal received from a control system. The control system converts triangular coordinates to pulse signals which control the stepper motors to position the probe support.

19 Claims, 12 Drawing Figures

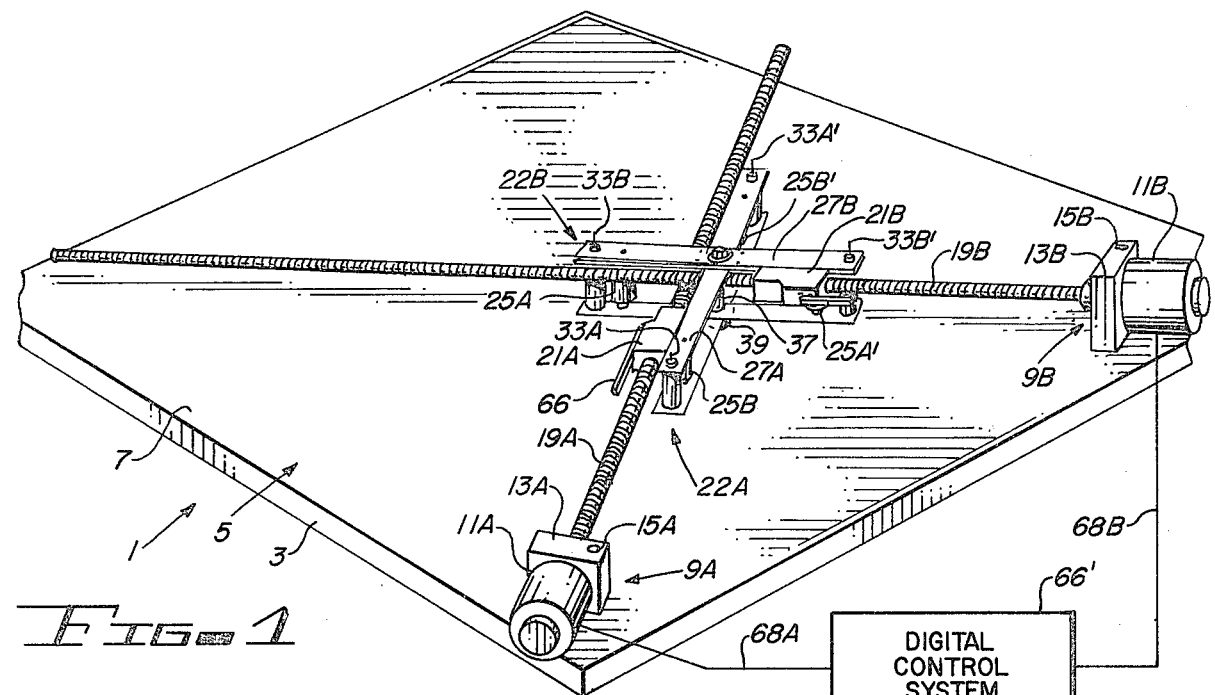
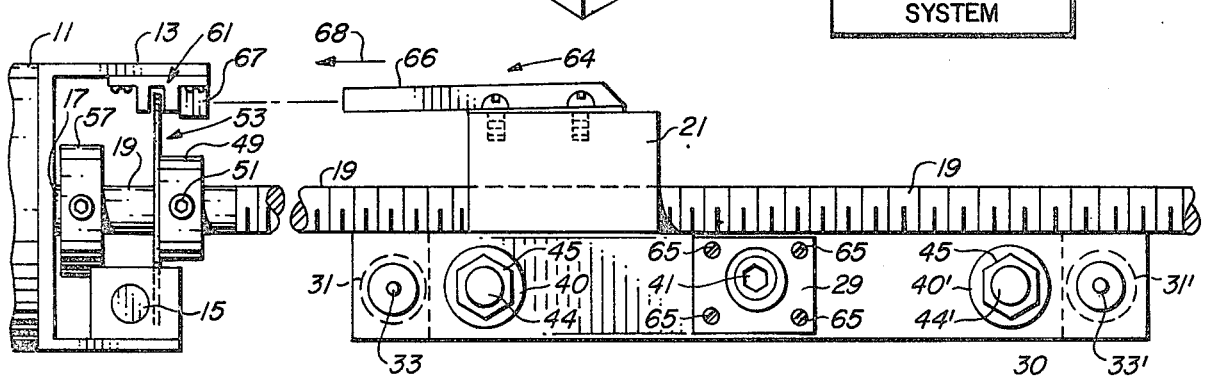
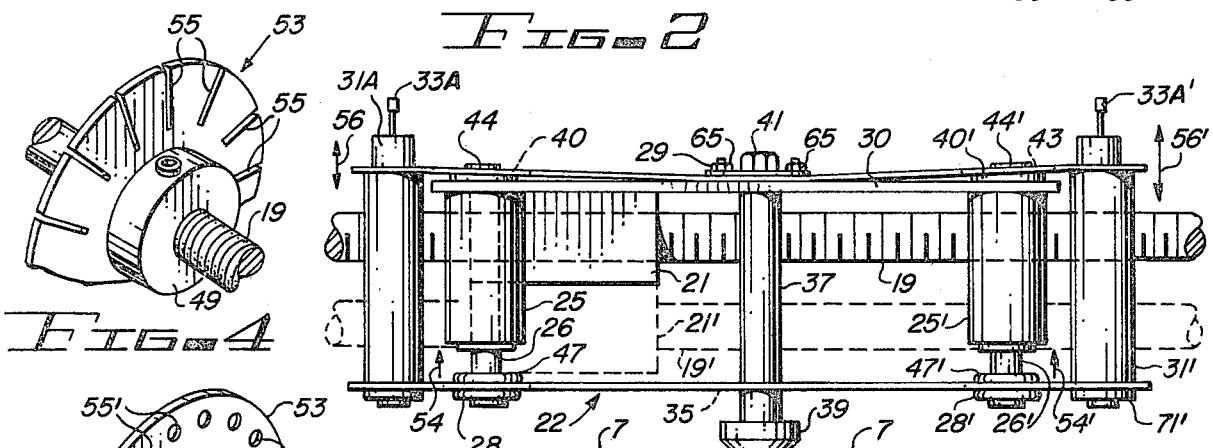
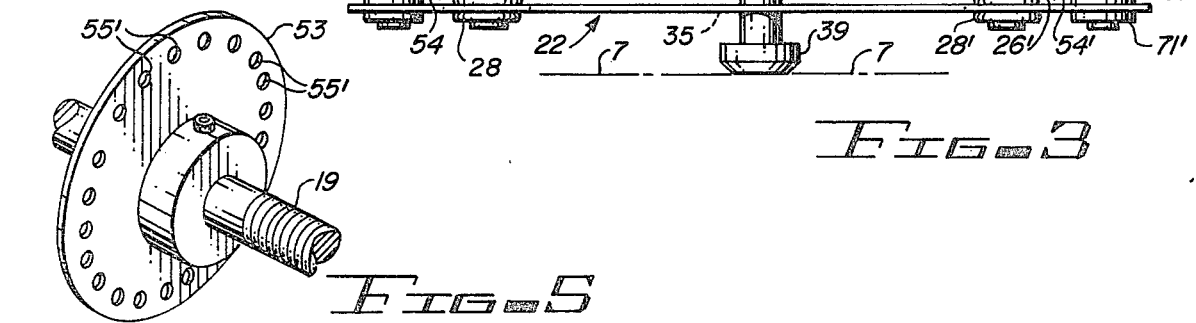

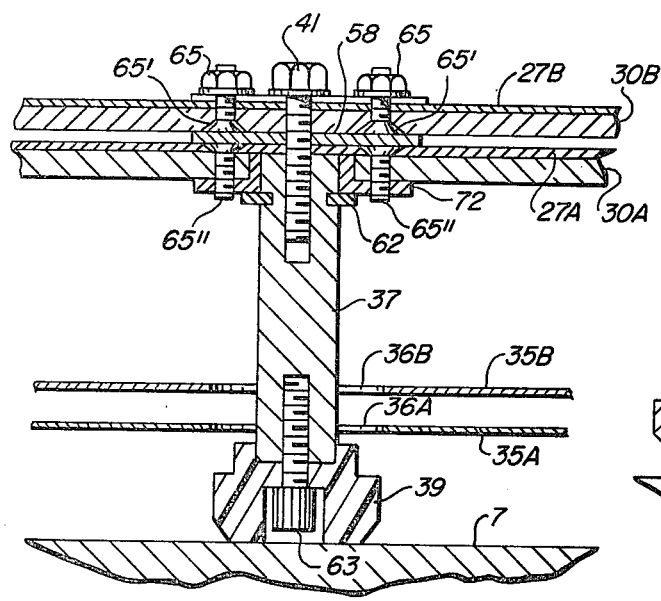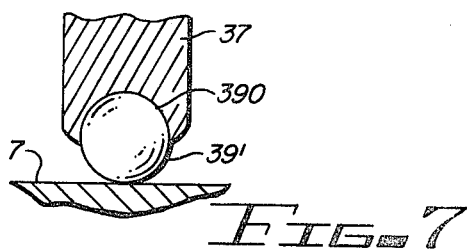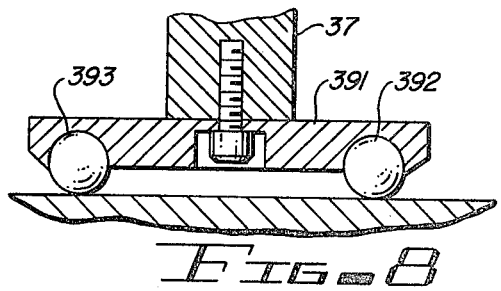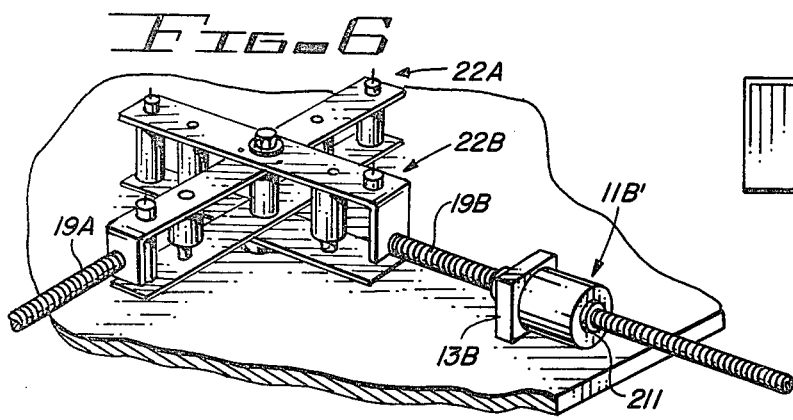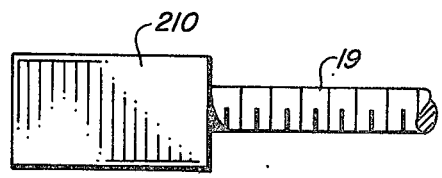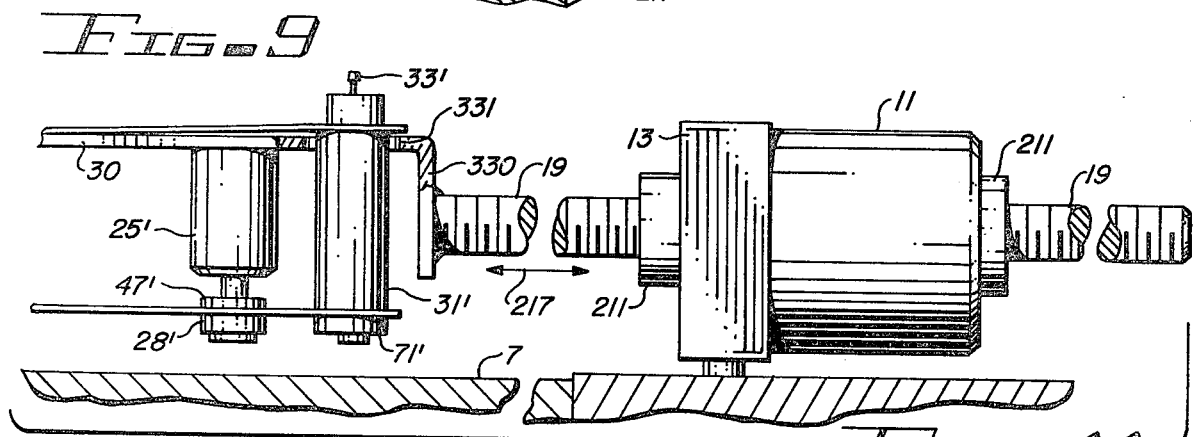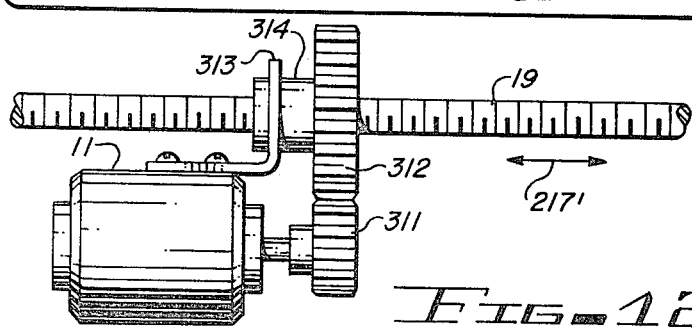

AUTOMATIC TEST PROBE POSITIONING APPARATUS

BACKGROUND OF THE INVENTION

1. Field of the Invention

The invention relates to test probe positioning machines and, more particularly, to test probe positioning machines which can be controlled by a digital control system storing information representing test point locations of a printed circuit board to be tested.

More particularly, the invention relates to test probe positioning machines which avoid perpendicular V-way guides and the like for conveying a test probe assembly to a predetermined coordinate location.

2. Description of the Prior Art

Complex electronic systems are conventionally constructed from mass produced printed circuit boards whch must be reliably tested prior to use. Consequently, there is a great need for high speed, low cost, low maintenance, highly reliable systems and methods for automatically testing such printed circuit boards. Known digitally controlled printed circuit board test systems usually include computing devices which store information representative of the location of predetermined test points of a particular printed circuit board to be tested. The printed circuit board test systems also provide a predetermined sequence of input test signals designed to adequately exercise all of the electronic components of the printed circuit board being tested and also store information representing the known correct responses for preselected test points. The actually measured responses of the preselected test points are measured by contacting them with a test probe and comparing the response actually measured with the known correct responses, which can be stored in digital form or can be concurrently produced by applying the same input test pattern to a known good printed circuit board. Since the dimensions of test points on printed circuit boards are very small (in order to effect high density placement of electronic components on the printed circuit board), the automatic test probe apparatus must be capable of very precise movement of the test probe in order to move them into contact with a particular test point of a printed circuit board under test. One known digitally controllable automatic test probe system includes a pair of precisely positioned parallel, elongated machined elements having triangular cross-sections. The two triangular cross-sectioned members are mounted in the same plane and are referred to as "V-ways". A pair of slide blocks having triangular grooves in the bottom surface thereof slidably move along the V-ways (which are referred to as "X" V-ways), in a direction referred to as the "X" direction. The slide blocks support another pair of relatively closely spaced elongated V-ways which are perpendicular to the "X" V-ways and are referred to as the "Y" V-ways. A pair of spaced blocks having precision V-shaped grooves which mate with the respective "Y" V-ways move slidably in the Y direction and support a platform upon which a test probe is mounted. The test probe can be raised or lowered by mechanical connection to a solenoid activated by a control signal produced by the digital system. Movement of the "Y" V-ways in the "X" direction along the "X" V-ways is achieved by means of a first stepper motor which drives a long first threaded shaft. The first threaded shaft passes through a threaded nut block rigidly attached to the "Y" V-ways. The platform is moved in the "Y" direction along the "Y" V-ways by means of a second stepper motor which drives a second long shaft passing through a second nut block attached to the platform. Digital signals which activate the first and second stepper motors provide information representative of the X and Y coordinates of a particular test point of the printed circuit board to be tested. Programming of conventional computerized testing systems to provide the digital control signals for the first and second stepper motors and for activating the probe tip and for producing the necessary input test patterns to the printed circuit board under test are widely utilized in the electronics industry and are readily implemented by those skilled in the art. The above described system can attain the needed precision to automatically probe test points of state of the art printed circuit boards. However, the described system has numerous shortcomings, one being slowness of operation due to high mass and high inertia.

Accordingly, it is an object of the invention to provide a high precision, digitally controlled printed circuit board test system having high speed operation.

Another object of the invention is to provide a digitally controlled printed circuit board test system having sufficiently high precision to test present state of the art printed circuit boards and having low mass.

The above described digitally controlled test probe systems are extremely expensive because extremely high precision components are required to provide reliablility. The above described V-ways must be constructed with extremely precise tolerances in order that "binding" be avoided as the test probe is moved by means of the above described sliding action of the slide blocks along the machined V-way surface. Extremely precise alignment is required.

It is therefore still another object of the invention to provide a high precision digitally controllable test probe system which is relatively inexpensive.

A further object of the invention is to provide a high precision digitally controllable test probe system which avoids the need for precision alignment operations prior to use of the digitally controllable test probe system.

A yet further object of the invention is to provide a high precision digitally controllable test probe system which avoids the need for use of high precision V-ways and the like.

The described prior art test probe system has high maintenance costs due to the need for precision realignment due to wearing of the sliding surfaces. The sliding surfaces must be carefully lubricated. The lubricated surfaces have a tendency to accumulate dirt and grit, which increases wear and causes binding which impairs operation of the device.

It is therefore a still further object of the invention to provide a low cost, high precision digitally controlled test probe system which avoids the maintenance costs associated with the above described prior art system.

A novelty search directed to the present invention uncovered U.S. Pat. Nos. 3,184,740, 3,230,622, 3,438,133, 3,495,519, 3,561,125 and 3,564,533.

SUMMARY OF THE INVENTION

Briefly described, and in accordance with one embodiment thereof, the invention provides a test probe positioning apparatus including a pair of hingeably connected support elements, each connected to a respective threaded nut block. First and second elongated threaded shafts mate with the respective nut blocks and are driven by first and second motors. As the threaded shafts turn, first and second support plates are supported on a low friction support foot which slides along a flat slide surface. The motors are spaced from each other and are pivotally connected to allow the first and second threaded shafts to swing laterally across the slide surface. Conductive test probes which can be raised or lowered by means of solenoid mechanisms are controlled by signals produced by digital control systems. In the described embodiment of the invention, the motors attached to the threaded shafts are stepper motors. Triangular coordinates corresponding to locations of test points to be contacted by the test probes are stored in the digital control system. An opaque disc having light slots or apertures therein attached to each threaded shaft repetitively interrupts the light path of an optical coupler. The optical coupler feeds digital information representing the angular position of the threaded shaft. The digital control system transmits digital pulses to the respective stepper motors until the angular position of the threaded shafts corresponds to a stored triangular coordinate to which a particular test probe is to be moved.

In the described embodiment of the invention, movable shafts of a pair of solenoids are connected to a lower flexure to which a pair of insulating probe supports are attached. Each solenoid is rigidly attached to the underside of one of the support plates. An upper flexure resting on and extending beyond the ends of that support plate holds an insulating probe support in a vertical position. When one of the solenoids is activated, the adjacent insulating probe support is raised, lifting the cooresponding test probe, causing it to contact a test point of a printed circuit board to be tested.

In an alternative embodiment of the invention, the threaded shafts do not turn, but are rigidly attached to the respective hingeably connected support elements. Instead, the threaded shafts extend through matingly internally threaded shafts which are rotatably driven by the respective stepper motors.

BRIEF DESCRIPTION OF THE DRAWINGS

FIG. 1 is a perspective view illustrating the test probe system of the present invention.

FIG. 2 is a partial sectional view illustrating one of the arms of the test probe system of FIG. 1.

FIG. 3 is a partial side view illustrating the pivotal connection of two arms of the test probe assembly of FIG. 1.

FIG. 4 is a partial perspective view illustrating a slotted control disc utilizable in the stepper motors of FIG. 1.

FIG. 5 is a perspective view of an alternative control disc which can be utilized in the stepper motors.

FIG. 6 is a partial sectional view illustrating a support post and a low friction slidable foot which supports the arms of the test probe assembly of FIG. 1.

FIG. 7 is a partial sectional view illustrating an alternative support for element 37 of FIG. 6.

FIG. 8 is a partial sectional view showing another alternate support system for element 37 of FIG. 6. FIG. 9 is a partial perspective view illustrating an alterntive embodiment of the invention.

FIG. 10 is a partial diagram illustrating an alternative connection element for attaching a stationary shaft to the embodiment of FIG. 9.

FIG. 11 is a detailed partial side view illustrating connection of the shaft to the probe supports and motors of the embodiment of FIG. 9.

FIG. 12 discloses a partial side view illustrating a motor driven threaded gear which moves the shaft of the embodiment of FIG. 9.

DESCRIPTION OF THE INVENTION

Referring now to the drawings, and particularly to FIG. 1, test probe assembly 1 includes a flat base plate 3. A flat machined slide surface 7 is disposed on base plate 3. A first stepper motor 11A is attached to a motor mount 13A. Motor mount 13A is pivotally supported above base plate 3 on vertical pivot rod 15A, which is rigidly attached to base plate 3. The rotary drive shaft 17 (FIG. 2) of stepper motor 11A is rigidly coupled to threaded screw rod or shaft 19A, which is long enough to extend diagonally across slide surface 7.

Threaded shaft 19A extends through a complementary threaded bore in threaded nut block 21A. Threaded nut block 21A is attached to a first probe support member 22A. Probe support member 22A carries test probes 33A and 33A' at its respective opposite ends. Test probes 33A and 33A' can be controllably raised and lowered by actuating solenoids 25B and 25B', respectively, as subsequently explained.

A second stepper motor 11B is rigidly attached to motor mount 13B. Motor mount 13B is pivotally supported by vertical pivot rod 15B, which extends from support plate 3. Threaded shaft 19B is rigidly connected to the drive shaft of stepper motor 11B in the manner previously described. Threaded shaft 19B extends through threaded nut block 21B. Threaded nut block 21B is rigidly attached to second probe support 22B, which carries test probes 33B and 33B' at the opposite ends thereof. Test probes 33B and 33B' can be controllably raised and lowered by means of solenoids 25A and 25A' in the manner previously described. It should be noted that the conductors for applying drive current to the above described solenoids have been omitted from the drawings for clarity.

First and second probe supports 22A and 22B are pivotally connected together at their midpoints and are supported by means of vertical pivot post 37. Pivot post 37 has a sliding Teflon foot 39 attached thereto. Sliding foot 39 has a flat bottomed low friction surface which easily slides along slide surface 7.

Thus, by applying suitable digital control signals to stepper motors 11A and 11B, threaded screw shafts 19A and 19B can be rotated to move any of the four probe tips 33A, 33A', 33B or 33B' to any predetermined location within the constraints imposed by the lengths of threaded shafts 19A and 19B and the lateral extent of slide surface 7.

A digital control system 66' may include a digital computer which stores information representing the triangular coordinate locations of test points of a printed circuit board (not shown) rigidly positioned above test probe assembly 1 with respect to a reference point of slide surface 7. A wide variety of commercially available microcomputer or minicomputer systems suitable for controlling the positions of the test probes 33A, 33A', etc., and for providing suitable digital input test patterns and expected responses are readily commercially available. The program for execution by such computers to operate the above described apparatus can be readily provided by those skilled in the digital testing and computer programming arts and therefore are not described herein.

Digital control system 66' provides digital signals for controlling stepper motors 11A and 11B by means of cables 68A and 68B, respectively.

The details of the probe supports 22A and 22B are now described with reference to FIGS. 2-5, as well as FIG. 1. For convenience, the letters are omitted from the reference numerals in FIGS. 2-5, since probe supports 22A and 22B are essentially identical, except that threaded nut blocks 21A and 21B are positioned at different levels to permit threaded shaft 19A to pass beneath threaded shaft 19B, as is clear from FIG. 1.

Referring now to FIGS. 2 and 3, probe support 22 includes a rigid upper support plate 30. A resilient upper flexure plate 27 (hereinafter referred simply as a flexure) is centrally attached to rigid plate 30 by means of clamp plate 29 and four bolts and nuts designated by reference numeral 65.

Upper flexure 27 is made from a strip of stainless steel approximately 1.38 inches wide and approximately 0.016 inches thick. For increased rigidity, if desired, flanges (not shown) may be provided on each side edge of upper flexure 27.

Upper flexure 27 has holes at opposite ends thereof, through which holes insulating test probe supports 31 and 31' extend, respectively. Conductive test probes 33 and 33' extend from the upper ends of probe supports 31 and 31', respectively. The upper end 31A of probe support 31 has a smaller diameter than the lower portion thereof. The diameter of upper end 31A closely fits the above mentioned hole on the left end of upper flexure 27. Therefore, the lower larger diameter section of probe support 31 provides a shoulder upon which the left end of upper flexure 27 rests. Right hand probe support 31' is supported similarly.

Lower flexure 35 also made from a strip of thin, flexible stainless steel, has its opposite ends attached to the lower ends of probe supports 31 and 31' by means of threaded screws 71 and 71' engaging the lower ends of probe supports 31 and 31', respectively.

A pair of solenoids 25 and 25' have their upper ends rigidly attached to opposite ends of rigid support plate 30 by means of threaded nuts 44 and 44'. Threaded nuts 44 and 44' engage threaded shafts extending from solenoids 25 and 25', respectively.

It should be noted that the opposed ends of rigid support plate 30 and solenoids 25 and 25' are located interiorly of probe supports 27 and 35.

Solenoid 25 has an axially movable shaft 26 extending from the lower end thereof. When solenoid 25 is actuated by a suitable control current, shaft 26 is pulled upward a predetermined distance in response to forces exerted by electrical windings (not shown) contained within the securely mounted portion of solenoid 25.

The lower end of movable shaft 26 of solenoid 25 is attached to lower flexure 35 by attachment means 28 and 47, which may, for example, include a rubber grommet which tightly engages movable shaft 26. Alternatively, attachment means 28 and 47 may include a threaded nut, a threaded shaft section, and a washer. A second solenoid 25' is connected to the opposite end of rigid support plate 30 and lower flexure 35 in a similar manner. Primed reference numerals are utilized to indicate parts of solenoid 25' similar to those previously described with reference to solenoid 25.

Rigid support plate 30 is supported by means of center support post 37. Center post 37 extends through a clearance hole 36. As previously explained, low friction foot 39 is attached to the lower end of post 37 and slides along slide surface 7.

Referring now particularly to FIG. 2, upper flexure 27 has a pair of clearance holes 40 and 40' through which nuts 44 and 44' extend. This allows the opposed ends of upper flexure 27 to move up and down in the directions indicated by arrows 56 and 56', respectively, when solenoids 25 and 25' are actuated and de-actuated by appropriate control currents.

Threaded nut block 21 and threaded shaft 19 of probe support 22 are illustrated in FIGS. 2 and 3. The relative positions of the threaded shaft and threaded nut block of another probe support pivotally connected in the manner indicated in FIGS. 1 and 6 is indicated by dotted lines 21' and 19' in FIG. 2.

Referring now to FIG. 6, the details of interconnecting pivot supports 22A and 22B of FIG. 1 are illustrated. Rigid support plates 30B and upper flexure 27B are attached to clamp plate 29 by means of countersunk screws 65' and nuts 65. A low friction plastic washer 58 is positioned between the lower surface of rigid support plage 30B and the upper surface of flexure 27B. Flexure 27B and rigid support plate 30B are secured against support washer 72 by means of countersunk screws 65''. Washer 72 is supported by a retaining ring 62 which extends into a groove of post 37. Bolt 41 extends through aligned holes in clamp plate 29, flexure 27B, rigid support plate 30B, washer 58, flexure 27B and rigid support plate 30B to a threaded hole in post 37 to secure the above elements together so that probe supports 22A and 22B can pivot with a scissors-like action. Lower flexures 35B and 35A of probe supports 22B and 22A, respectively, have clearance holes 36B and 36A, disposed therein. Post 37 extends through clearance holes 36B and 36A, and is connected to low friction slidable foot 39 by means of screw 63.

Referring now to FIG. 2, the system for sensing angular position of threaded shaft 14 and stepper motor 11 includes a slotted disc 53 having a collar 49 which engages threaded shaft 19 by means of a set screw 51. Threaded shaft 19 is connected to the rotary drive shaft of stepper motor 11 by means of a mechanical coupling element 57. An optical coupler 61, such as a Model H13A1, manufactured by General Electric Co., including a light emitting source and a photosensitve source is mounted on the inner wall of motor mount 13. The light path between the light source and photosensitive detector of optical coupler 61 is interrupted by disc 53 so that optical coupler 61 produces a sequence of pulses, one pulse for each slot 55 which passes across the light path when stepper motor 11 is rotating shaft 19. Thus, the angular position of shaft 19 can be continuously determined by merely counting the number of pulses produced by optical coupler 61 and the direction of rotation of stepper motor 11 as it rotates from a predetermined reference angular position. Those skilled in the art can readily provide the necessary sensing circuitry for detecting the pulses produced by optical coupler 61 and producing a suitable sequence of digital pulses therefrom.

In use, a microcomputer is included in digital control system 66' and stores the triangular coordinates to which the probe supports 22A and 22B must be moved in order to move a particular one of test probes 33A or 33A' to a particular location corresponding to a particular test point on a printed circuit board suspended above test probe system 1. The microprocessor produces a sequence of digital pulses via cable 68A, causing stepper motor 11A to rotate shaft 19A so that the probe support 22A moves in the desired direction. Similarly, control pulses are transmitted to stepper motor 11B via cable 68B, causing probe support 22B to also move in the direction necessary to move, for example, test point 33B to a predetermined test point location. Slotted discs 53 and associated optical couplers 61 and suitable pulse shaping circuitry associated with stepper motors 11A and 11B produce corresponding sequences of pulses representing the actual locations of probe supports 22A and 22B. These sequences of pulses are fed into the microcomputer system. The microcomputer system utilizes this information to stop rotation of shafts 19A and 19B when probe supports 22A and 22B have been moved to the positions represented by the stored triangular coordinates corresponding to the location of the test point to be tested.

Reference points for positions of probe supports 22A and 22B along shafts 19A and 19B, respectively, are determined by means of respective second optical couplers and associated with stepper motors 11A and 11B. This is best explained with reference to FIG. 2.

Referring now to FIG. 2, an opaque reference arm 64 is attached to nut block 21. Reference arm 64 includes an extending end 66 which, when moved in the direction indicated by arrow 68 as a result of turning of shaft 19 by stepper motor 11, eventually interrupts the light path of optical coupler 67, which is identical to optical coupler 61. This produces a control pulse which is transmitted to the microcomputer, which then causes stepper motor 11 to stop at its present position. The corresponding angle of threaded shaft 19 is referred to as the "reference angle" with respect to which all other angular positions of threaded shaft 19 are measured.

The extending arm 66 attached to nut block 21A in FIG. 1 is shown, but has been omitted from probe support 22B in FIG. 1 for clarity.

The stepper motors 11A and 11B are four phase stepper motors manufactured by North American Phillips Controls Corporation, and are identified by their catalog number K82944-M1. Various other commercially available stepper motors could also be utilized. Solenoids 25 and 25' can be implemented utilizing Model MEB-16X2 solenoids, manufactured by Deltrol Controls Corporation.

Although various methods of programming digital control system 66' to provide suitable control signals for controlling stepper motors 11A and 11B and the solenoids of probe supports 22A and 22B can be easily implemented by those skilled in the art, the most straightforward approach is to simply store the triangular coordinates of each test point of the printed circuit board to be tested in the microprocessor system included in digital control system 66'. This avoids the necessity of performing real-time computations (using well known trigonometric formulas) converting the rectangular coordinates of each test point to the triangular coordinates required by the nature of the variable triangle formed by the system shown in FIG. 1. The most convenient way for obtaining the triangular coordinates is to utilize magnetic tapes ordinarily utilized by electronic digital control systems to control automatic drilling machinery which drills the "via" holes in printed circuit boards during their manufacture. The information on these tapes indentifies the locations of all of the intergrated circuit leads mounted on a particular printed circuit board. These locations would ordinarily include all or nearly all of the desired test points of a printed circuit board. This information can be fed into a computer containing an algorithm for computing the desired triangular coordinates, which then are fed into the microcomputer in digital control system 66'.

The amount of time required for moving the assembly including probe supports 22A and 22B and low friction foot 39 is reduced by providing test probes on opposite ends of each of the probe supports 22A and 22B. The digital control system then need only move the closest of the four probe tips to the next test point to be probed.

The described embodiment of the invention is capable of moving the probe tips to predetermined test point locations with an accuracy of several mils. The system is capable of much faster, more reliable operation than the previously described prior art, and can be implemented and maintained at far lower cost.

In order to avoid friction which results as sliding foot 39 slides along support surface 7, the sliding foot 39 can be replaced by low friction ball bearings disposed at the lower end of pivot shaft 37, as shown in FIGS. 7 and 8. Referring to FIG. 7, precision ball 39' is disposed in a precision socket 390 formed in the lower end of pivot support 37. FIG. 8 discloses an alternative embodiment which two precision balls 392 and 393 are disposed in spaced sockets disposed in a support element 391 attached to the lower end of pivot support 37.

As explained above, the embodiment of the invention shown in FIGS. 1-3 includes rotating threaded shafts 19A and 19B which are driven by stepper motors 11A and 11B, the threaded shafts being received by threaded nut blocks 21A and 21B attached to the probe support members 22A and 22B, respectively. It should be noted that the disclosed threaded nut blocks could be divided, half being attached at one end of the corresponding probe support and the other half being attached at the opposite end of the corresponding probe support to provide increased stability of the probe support with respect to the threaded shafts.

Another embodiment of the invention, shown in FIGS. 9-11, utilizes non-rotating shafts 19A and 19B which are rigidly attached to the support plates 30. The stepper motors have an internally threaded shaft which serves as a rotating nut block through which the threaded shafts 19A and 19B respectively extend.

Referring now to FIG. 9, probe supports 22A and 22B are pivotally connected together in the manner previously described. Referring also to FIG. 11, it can be seen that support plate 30 has a clearance hole 31 through which probe support 31' freely extends. A vertical element 330 is rigidly attached to the extreme end of support plate 30. One end of threaded shaft 19 is welded or otherwise rigidly attached to element 330. Threaded shaft 19 extends through internally threaded drive shaft 211 of stepper motor 11. Stepper motor 11 is pivotally attached by means of mount 13 to vertical pivot rod 15, which extends vertically upward from the plane of support surface 7. Thus, as the rotor of stepper motor 11 rotates, internally threaded shaft 211 rotates, causing threaded shaft 19 to move in the directions indicated by double arrow 217, depending on the direction of rotation of internally threaded shaft 211.

The embodiment of the invention shown in FIGS. 9 and 11 has the advantage that a more rigid relationship between plate 30 and threaded shaft 19 is attained, but has the disadvantage that the device requires additional operating space because the ends of threaded shaft 19 extend beyond the end of the stepper motor.

FIG. 11 discloses an alternate means of connecting threaded shaft 19B to support plate 30. Block 210 is rigidly attached to threaded shaft 19. Block 210 is also rigidly attached, for example, by welding, to the edge of support plate 30.

FIG. 12 discloses an alternate means of driving threaded shaft 19, wherein it is not necessary to utilize a stepper motor having an internally threaded shaft. Referring now to FIG. 12, stepper motor 11 has a gear 311 attached to its rotary drive shaft. A bracket 313 is attached to the housing of stepper motor 11 or to the pivotable mount (not shown) to which stepper motor 11 is attached. Bracket 311 rotatably supports an internally threaded shaft 314 upon which a second gear 312 is concentrically mounted. Gear 311 drives gear 312, causing threaded shaft 19 to move laterally in the directions indicated by double arrow 217'.

While the invention has been described with reference to a particular embodiment thereof, those skilled in the art will be able to make various modifications to the described embodiments without departing from the true spirit and scope of the invention. For example, various other coordinate systems than a triangular coordinate system could be utilized.

I claim:

1. A test probe system for use in automatic testing of printed circuit boards, said test probe system comprising in combination:
   a. a substantially flat slide surface;
   b. first and second threaded shafts extending over said slide surface, said first and second threaded shafts being substantially parallel to said slide surface, said first threaded shaft crossing over said second threaded shaft;
   c. first and second drive means for controllably axially rotating said first and second threaded shafts, respectively;
   d. support means for supporting said first and second drive means, said support means having first and second points located in fixed relationship to said slide surface;
   e. pivot means for pivotally connecting said first and second drive means to said support means at said first and second points, said first and second threaded shafts being pivotable laterally over said slide surface;
   f. first and second shaft receiving means for receiving said first and second shafts, respectively;
   g. connecting means for pivotally connecting said first and second shaft receiving means, a triangle substantially parallel to said slide surface being defined by said first and second points and a point at which said connecting means pivotally connects said first and second shaft receiving means, the angles and lengths of the sides of the triangle being variably dependent on the angular positions of said first and second threaded shafts with respect to first and second reference angular positions of said first and second threaded shafts, respectively; and
   h. probe support means carried by one of said first and second shaft receiving means for supporting a first conductive probe.

2. The test probe system of claim 1 further including slide support means supporting said first and second shaft receiving means, said slide support means having a low friction surface which slides across said slide surface as said first and second shaft supporting means are moved toward or away from said first and second points in response to rotation of said first and second threaded shafts, respectively.

3. The test probe system of claim 2 wherein said first and second shaft receiving means includes first and second nut blocks having threaded apertures through which said first and second threaded shafts extend, respectively.

4. The test probe system of claim 3 wherein said threads of said first and second nut blocks are complementary to the threads of said first and second threaded shafts, respectively.

5. The test probe system of claim 2 further including first probe raising means for raising said first probe support means in response to a first control signal.

6. The test probe system of claim 5 wherein said first and second drive means include first and second stepper motors having rotary shafts connected to ends of said first and second threaded shafts, respectively, said first and second stepper motors being responsive to first and second digital control signals, respectively, to turn said first and second threaded shafts either clockwise or counterclockwise, depending on the digital patterns comprised by said first and second digital control signals.

7. The test probe system of claim 6 further including first and second sensing means for sensing the angular displacements of said first and second threaded shafts, respectively.

8. The test probe system of claim 7 wherein one of said first and second sensing means includes a first optical coupler and a disc having a plurality of substantially equally angularly exposed light admitting openings therein for repetitively interrupting the light path of said first optical coupler.

9. The test probe system of claim 8 wherein each of said first and second sensing means further includes a sensing circuit responsive to said first optical coupler for producing a digital signal each time one of said light admitting openings allows the light path of said first optical coupler to be completed.

10. The test probe system of claim 9 wherein each of said first and second sensing means further includes reference establishing means for establishing reference angular positions with respect to which said angular displacements are measured.

11. The test probe system of claim 10 wherein said reference establishing means includes a light interrupting element attached to one of said first and second shaft receiving means and a second optical coupler attached in fixed relationship to one of said stepper motors for producing a signal indicating that the angular position of one of the threaded shafts is the reference angular position of that shaft when the light interrupting element interrupts the light path of said optical coupler as a result of said one of said shaft receiving means being moved toward said second optical coupler.

12. The test probe system of claim 11 wherein said first shaft receiving means includes:
   a. a horizontal rigid support plate;
   b. a threaded nut block through which said first shaft extends, the threads of said first shaft mating with the threads of said nut block;
   c. a first flexure centrally attached to said support plate and having opposed ends extending beyond the ends of said support plate;

d. first and second insulating probe supports having upper end portions engaging said opposed ends of said flexure, respectively;
e. a second flexure engaging lower ends of said first and second insulating probe supports, respectively; and
f. first and second solenoids connected between said second flexure and said support plate adjacent said first and second insulating probe supports, respectively, said first and second solenoid lifting said insulating probe supports when said first and second solenoids, respectively, are actuated.

13. The test probe system of claim 12 wherein said second shaft means is constructed similarly to said first shaft receiving means, said test probe system further including means for sensing when the angle between said first and second shaft receiving means exceeds a predetermined angle.

14. The test probe system of claim 12 including a digital control system storing digital information representing coordinates corresponding to locations of a plurality of test points to be automatically probed by said test probe system.

15. The test probe system of claim 14 wherein said digital control system produces said first and second digital control signals for said first and second stepper motors, causing said first and second stepper motors to rotate said threaded shafts to move a test probe supported by one of said probe support means to a first location corresponding to one set of said coordinates, said digital control system stopping rotation of said threaded shafts when the signals received from said sensing circuits indicate that said first location has been reached by said test probe.

16. A test probe system for use in automatic testing of printed circuit boards, said test probe system comprising in combination:
a. a substantially flat slide surface;
b. first and second threaded shafts extending over said slide surface, said first and second threaded shafts being substantially parallel to said slide surface, said first threaded shaft crossing over said second threaded shaft;
c. first and second shaft receiving means rigidly attached to said first and second shafts, respectively;
d. first and second rotatable threaded shaft receiving means for mating with the threads of said first and second threaded shafts, respectively, to cause lateral movement of said first and second shafts and said first and second shaft receiving means with respect to said slide surface;
e. first and second drive means for controllably rotating said first and second rotatable threaded shaft receiving means, respectively;
f. support means for supporting said first and second drive means, said support means having first and second points located in fixed relationship to said slide surface;
g. pivot means for pivotally connecting said first and second drive means to said support means at said first and second points, said first and second threaded shafts being pivotable laterally over said slide surface;
h. connecting means for pivotally connecting said first and second shaft receiving means, a triangle substantially parallel to said slide surface being defined by said first and second points and a point at which said connection means pivotally connects said first and second shaft receiving means, the angles and lengths of the sides of the triangle being variably dependent on the angular positions of said first and second threaded shafts with respect to first and second reference angular positions of said first and second threaded shafts, respectively; and
i. probe support means carried by one of said first and second shaft receiving means for supporting a first conductive probe.

17. The test probe system of claim 16 further including slide support means supporting said first and second shaft receiving means, said slide support means having a low friction surface which slides across said slide surface as said first and second shaft supporting means are moved toward or away from said first and second points in response to rotation of said first and second threaded shafts, respectively.

18. The test probe system of claim 17 further including first probe raising means for raising said first probe support means in response to a first control signal.

19. The test probe system of claim 18 wherein said first and second drive means include first and second stepper motors having rotary shafts which rotate said first and second rotatable threaded shaft receiving means, respectively, said first and second stepper motors being responsive to first and second digital control signals, respectively, to turn said first and second threaded shaft receiving means either clockwise or counterclockwise, depending on the digital patterns comprised by said first and second digital control signals.

* * * * *